United States Patent [19]

Takahashi

[11] Patent Number: 4,918,657
[45] Date of Patent: Apr. 17, 1990

[54] SEMICONDUCTOR MEMORY DEVICE PROVIDED WITH AN IMPROVED PRECHARGE AND ENABLE CONTROL CIRCUIT

[75] Inventor: Yasushi Takahashi, Tokyo, Japan
[73] Assignee: NEC Corporation, Tokyo, Japan
[21] Appl. No.: 169,683
[22] Filed: Mar. 18, 1988

[30] Foreign Application Priority Data
Mar. 18, 1987 [JP] Japan .................... 62-64671

[51] Int. Cl.$^4$ .................... G11C 7/00; H03K 5/13
[52] U.S. Cl. .................... 365/203; 365/189.08; 365/233; 307/269; 307/480; 328/63
[58] Field of Search .......... 365/203, 233, 230, 189.08, 365/230.06; 328/62, 63; 377/76, 78, 80; 307/269, 480

[56] References Cited

U.S. PATENT DOCUMENTS

| | | | |
|---|---|---|---|
| 3,801,827 | 4/1974 | Sequin | 307/269 |
| 4,040,122 | 8/1977 | Bodin | 365/233 |
| 4,463,440 | 7/1984 | Nishiura et al. | 328/62 |
| 4,570,082 | 2/1986 | Maley et al. | 307/480 |
| 4,755,964 | 7/1988 | Miner | 365/233 |

Primary Examiner—Glenn A. Gossage
Attorney, Agent, or Firm—Sughrue, Mion, Zinn, Macpeak & Seas

[57] ABSTRACT

For producing control signals in a semiconductor memory device, each appearing without an idling time period, a control signal generating circuit comprises a plurality of sequential logical circuits associated with the controlled circuits for supplying the control signals thereto, respectively, and the sequential logical circuits include a first sequential logical circuit responsive to an external control signal and one of the control signals fed from another sequential logic circuit for shifting a logic state thereof between a first logic level and a second logic level, but each of the sequential logic circuits except for the first sequential logic circuit are responsive to the inverse of the external control signal and the output signal fed from one of the controlled circuits for shifting a logic state thereof between the first logic level and the second logic level, so that each of the control signals are produced in the first logic level.

9 Claims, 5 Drawing Sheets

FIG. 1
PRIOR-ART

SEMICONDUCTOR MEMORY DEVICE PROVIDED WITH AN IMPROVED PRECHARGE AND ENABLE CONTROL CIRCUIT

FIELD OF THE INVENTION

This invention relates to a control signal generating circuit and, more particularly, to a control signal generating circuit operative to produce a plurality of control signals for a read/write operation carried out in a semiconductor memory device.

BACKGROUND OF THE INVENTION

Figure 1:
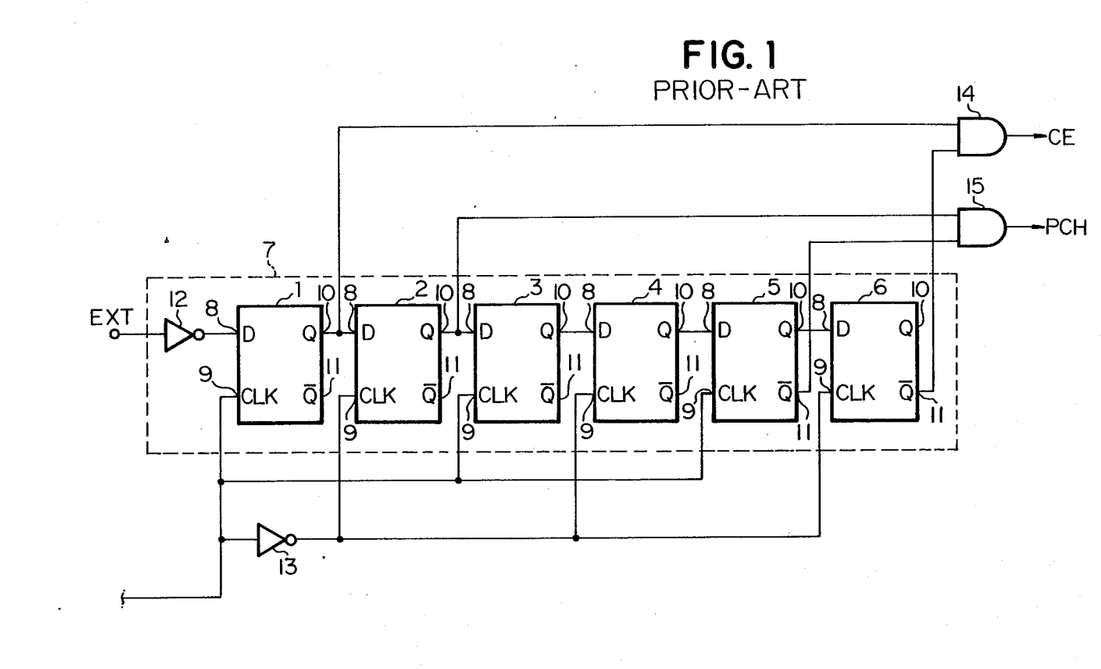
FIG. 1 is a circuit diagram showing the arrangement of a well-known control signal generating circuit incorporated in a semiconductor memory device.

A typical example of the the control system generating circuit incorporated in the semiconductor memory device is illustrated in FIG. 1 of the drawings. The control signal generating circuit illustrated in FIG. 1 largely comprises a plurality of flip-flop circuits 1, 2, 3, 4, 5 and 6 connected in cascade to form a shift register circuit 7, and each of the flip-flop circuits 1 to 6 has an input terminal 8, a clock terminal 9 and a pair of output terminals 10 and 11. The first flip-flop circuit 1 is electrically connected at the input terminal 8 to an inverter circuit 12 which is supplied with an external control signal EXT from the outside thereof, and the input terminals 8 of the second to final flip-flop circuits 2 to 6 are coupled to the output terminals 10 of the first to fifth flip-flop circuits 1 to 5, respectively. A clock signal CLK is directly supplied to the clock terminals 9 of the first, third and fifth flip-flop circuits 1, 3 and 5, but the remaining flip-flop circuits 2, 4 and 6 are supplied at the clock terminals CLK thereof with the inverse of the clock signal fed from an inverter circuit 13.

For production of a chip enable signal CE and a precharging signal PCH, the control signal generating circuit illustrated in FIG. 1 further comprises two-input AND gates 14 and 15. The AND gate 14 is connected at the two input terminals thereof to the output terminal 10 of the first flip-flop circuit 1 and the output terminal 11 of the final flip-flop circuit 6, respectively, and the two input terminals of the AND gate 15 are coupled in parallel to the output terminal 10 of the flip-flop circuit 2 and the output terminal 11 of the flip-flop circuit 5.

In operation, the AND gate 14 produces the chip enable signal CE rising to an active high voltage level synchronous with the active high voltage level appearing at the output terminal 10 of the first flip-flop circuit 1 and decaying synchronous with the active high voltage level at the output terminal 10 (or the inactive low voltage level at the output terminal 11) of the final flip-flop circuit 6. In a similar manner, the AND gate 15 produces the precharging signal PCH rising to an active high voltage level synchronous with the active high voltage level at the output terminal 10 of the second flip-flop circuit 2 and decaying in synchronous with the active high voltage level at the output terminal 10 of the flip-flop circuit 5. Each of the flip-flop circuits 1 to 6 is shifted between two stable output states in response to the clock signal CLK or the inverse thereof, so that the duration of each control signal is decided by the number N of the stages of flip-flop circuits between the two input terminals thereof to be N times longer than the width of each clock pulse CLK. Thus, the control signal generating circuit illustrated in FIG. 1 is operative to produce the control signals CE and PCH each having the duration which is N times longer than the width of each clock pulse CLK.

However, a problem in encountered in the prior-art control signal generating circuit in precise determination of the duration of the control signal. In detail, each control signal continues in the active level for a time period N times longer than the width of the clock pulse CLK as described above, so that a higher frequency clock signal is needed for production of timings close to each other. The higher frequency the clock signal has, the less reliability the control signal generator has in operation. Moreover, another difficulty is encountered in the prior-art control signal generating circuit in circuit design and in integration layout if a higher frequency clock signal is used. Then, another approach should be taken to produce the close timings for the control signals.

SUMMARY OF THE INVENTION

It is therefore an important object of the present invention to provide a control signal generating circuit which is capable of producing a plurality of control signals precisely appearing at small intervals.

It is another important object of the present invention to provide a control signal generating circuit which is simplified in circuit arrangement.

It is still another important object of the present invention to provide a control signal generating circuit which is appropriate to a semiconductor memory device.

To accomplish these objects, the present invention proposes to form a chain formed by a plurality of sequential logical circuits each producing a control signal and alternated with each controlled circuit supplied with the control signal for a predetermined operation.

In accordance with the present invention, there is provided a semiconductor memory device fabricated on a semiconductor substrate, comprising, (a) a control node to which an external control signal is applied, the external control signal being shifted between a first level and a second level, (b) a memory cell array having a plurality of memory cells each arranged in a matrix form of rows and columns, c) an address decoder circuit having a plurality of decoder outputs coupled to said rows, for selecting one of the decoder outputs actuated by a first control signal in an active level on the basis of an external address signal, the first control signal being shifted between the active level and an inactive level, (d) a precharging circuit actuated by a second control signal in an active level and performing a precharging operation prior to a read/write operation, the second control signal being shifted between the active level and an inactive level, (e) a first control circuit responsive to the external control signal in the second level for shifting the first control signal from the active level to the inactive level and to the second control signal in the inactive level for shifting the first control signal from the inactive level to the active level, (f) a logic gate producing an additional control signal of the first level when all of said decoder outputs are in an inactive state, the additional control signal being shifted between the first level and the second level, and (g) a control circuit responsive to the external control signal in the first level for shifting the second control signal from the active level to the inactive level and to the additional control signal in the first level for shifting the second control signal from the inactive level to the active level.

The first sequential logical circuit may be formed by a flip-flop circuit such as, for example, of the R-S type having two input nodes one of which is supplied with the inverse of the external control signal and the other of which is supplied with the second control signal. The second sequential logical circuit may be formed by a flip-flop circuit such as, for example, of the R-S type having two input nodes one of which is supplied with the external control signal and the other of which is supplied with the additional control signal, and an inverter circuit coupled to an output node of the flip-flop circuit and producing the second control signal.

In one implementation, the logic gate carries out a NOR operation, however the logic gate may comprise two NOR gates each supplied with a part of the internal address signal and an AND gate supplied with output signals fed from the two NOR gates for production of the additional control signal.

BRIEF DESCRIPTION OF THE DRAWINGS

The features and advantages of a control signal generating circuit according to the present invention will be more clearly understood from the following description taken in conjunction with the accompanying drawings in which.

DESCRIPTION OF THE PREFERRED EMBODIMENT

Figure 2:
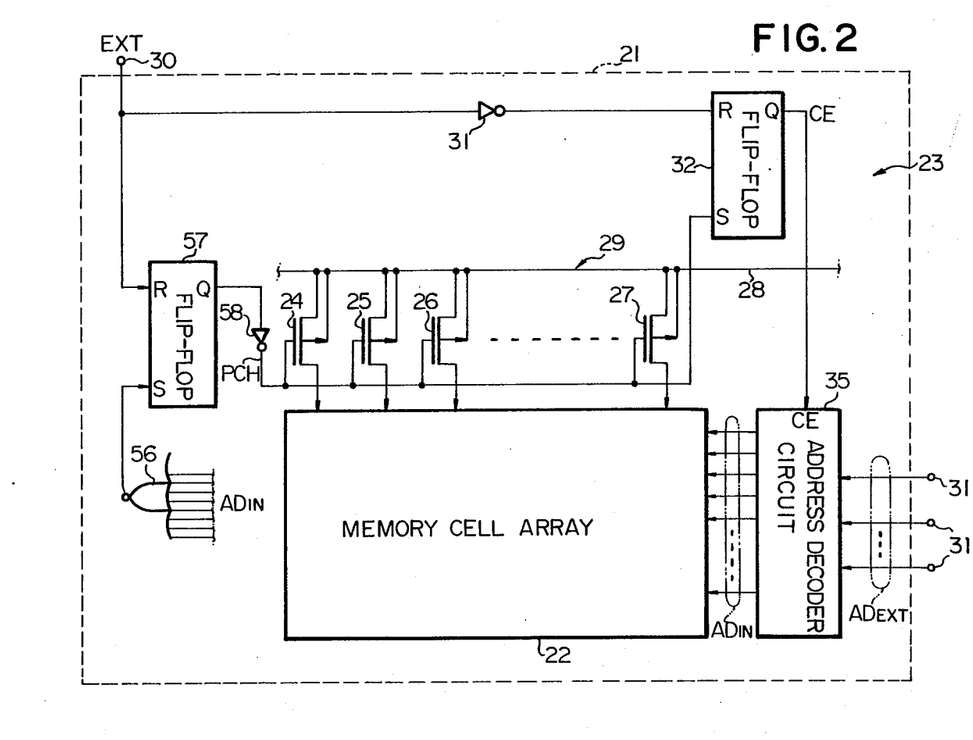
FIG. 2 is a circuit diagram showing the arrangement of a semiconductor memory device according to the present invention.

Referring first to FIG. 2 of the drawings, there is shown the circuit arrangement of a semiconductor memory device embodying the present invention. The semiconductor memory device is fabricated on a semiconductor substrate 21, typically a single crystal silicon, and largely comprises a memory cell array 22 having a plurality of random access memory cells arranged in rows and columns, and a peripheral circuit 23. Though not shown in the drawings, each of the columns is accompanied by a bit line, and all of the bit lines are respectively coupled at first ends thereof to p-channel type precharging transistors including transistors 24, 25, 26 and 27, and all of the precharging transistors are coupled at second other ends thereof to a source of positive voltage 28. The precharging transistors as a whole constitute a precharging circuit 29, and the function of the precharging circuit 28 is well known in the art, so that no further description will be incorporation. Each row is accompanied by a word line. The semiconductor memory device illustrated in FIG. 2 is provided with a plurality of control terminals including a control terminal 30 and a plurality of address terminals 31, and an external control signal EXT is supplied from the outside thereof to the control terminal. The control terminal 30 is coupled to the input node of an inverter circuit 31, the output node of which in turn is coupled to a resetting node R of a first R-S type flip-flop circuit 32. The inverter circuit 31 is operative to produce the inverse of the external control signal EXT and the inverse signal is supplied to the resetting node R of the first R-S type flip-flop circuit 32.

Figure 3:
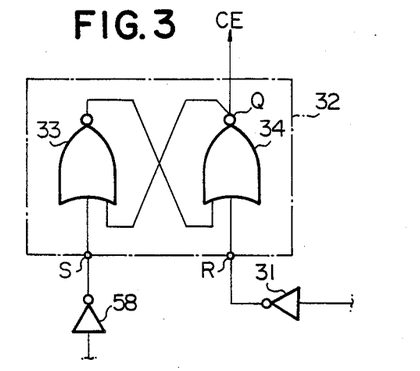
FIG. 3 is a logic diagram showing the arrangement of the first flip-flop circuit incorporated in the semiconductor memory device illustrated in FIG. 2.

The first R-S type flip-flop circuit 32 comprises two NOR gates 33 and 34 as illustrated in FIG. 3, and each of the NOR gates 33 and 34 has two input nodes and an output node. One of the two input nodes of the NOR gate 33 is coupled to the output node of the other NOR gate 34, and the output node of the NOR gate 34 is similarly coupled to one of the input nodes of the NOR gate 33. The remaining input nodes of the NOR gates 33 and 34 respectively serve as the setting node S and the resetting node R of the first R-S type flip-flop circuit 32, and the output node of the NOR gate 34 serves as the output node Q of the first R-S type flip-flop circuit 32. The first R-S type flip-flop circuit 32 thus arranged is operative to produce a chip enable signal CE of an active high voltage level, or a first control signal when the inverter circuit 31 supplies the inverse of a precharging signal PCH or a second control signal of a low voltage level to the resetting node R. However, when the external control signal EXT goes down to the low voltage level and, accordingly, the high voltage level is supplied from the inverter circuit 31 to the resetting node R of the first R-S type flip-flip circuit 32, the first R-S type flip-flop circuit 32 is shifted to the resetting state, thereby allowing the chip enable signal CE to go down to an inactive low voltage level.

Figure 4:
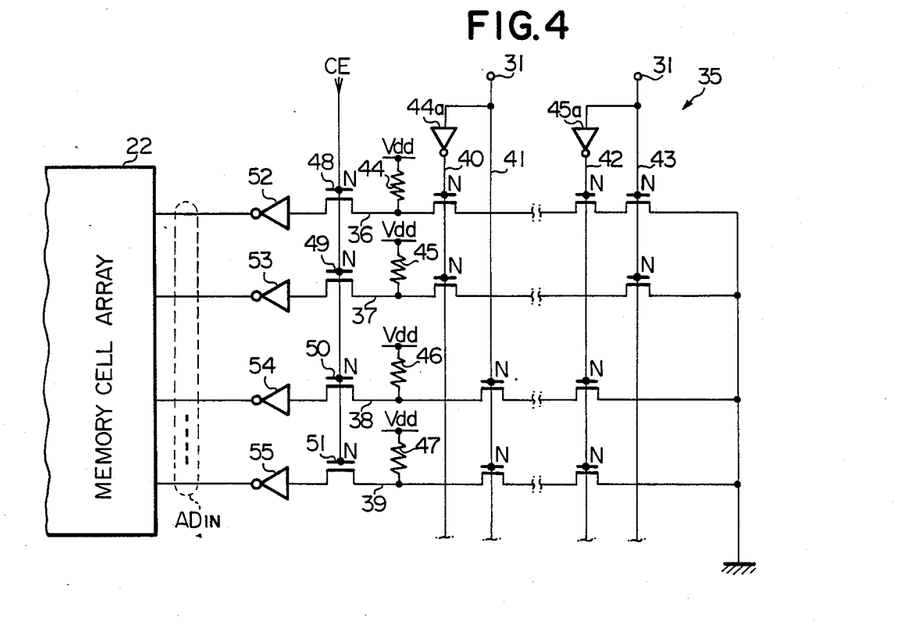
FIG. 4 is a diagram showing the circuit arrangement of the address decoder circuit incorporated in the semiconductor memory device illustrated in FIG. 2.

The output node Q of the first R-S type flip-flop circuit 32 is coupled to the control node of an address decoder circuit 35, and the circuit arrangement of the address decoder circuit 35 is illustrated in detail in FIG. 4 of the drawings. The address decoder circuit 35 illustrated in FIG. 4 comprises a plurality of output lines including output lines 36, 37, 38 and 39, a plurality of control lines twice larger in number than the address terminals 31. Namely, each of the address terminals are coupled in parallel to two of the control lines such as the control lines 40 and 41 or 42 and 43, one of the two control lines is directly coupled to the address terminal, but the other control line is coupled to the same address terminal through an inverter circuit such as an inverter circuit 44a or 45a. A series of n-channel MIS type field effect transistors are provided in each of the output lines, and the gate electrodes of the MIS type field effect transistors are coupled to or are not coupled to the control lines. Each of the output lines are supplied from each pull-up resistor 44, 45, 46 or 47 with a high voltage level, so that external address signals $AD_{ext}$ applied to the address terminals 31 are decoded to form the inverse of a word line drive signal. The output lines 36, 37, 38 and 39 and the other output lines are coupled to n-channel gate transistors including n-channel gate transistors 48, 49, 50 and 51, the gate electrodes of which are coupled to the control node of the address decoder circuit 35 where the chip enable signal CE appears. Then, the inverse of the word line drive signal is transferred or blocked by the gate transistors depending upon the voltage level of the chip enable signal CE. Between the memory cell array 22 and the gate transistors including the transistors 48 to 51 are coupled a plurality of inverter circuits which produce the word line drive signal AD$_{IN}$ representing an address information on the external address signal AD$_{ext}$. In FIG. 4, only four of the inverter circuits are shown with reference numerals 52, 53, 54 and 55.

Turning back to FIG. 2 of the drawings, the word line drive signal AD$_{IN}$ is also supplied to input nodes of a NOR gate 56, and the output node of the NOR gate 56 is coupled to the setting node S of a second R-S type flip-flop circuit 57. The NOR gate 56 produces an additional control signal of the high voltage level when all of the address bits of the word line drive signal AD$_{IN}$ are in logic "0" levels, or in the low voltage levels. The output node Q of the second R-S type flip-flop circuit 57 is coupled to an inverter circuit 58, and the inverter circuit 58 produces the precharging signal PCH of an active low voltage level during application of the output signal of the high voltage level fed form the second R-S type flip-flop circuit 57.

Figure 5:
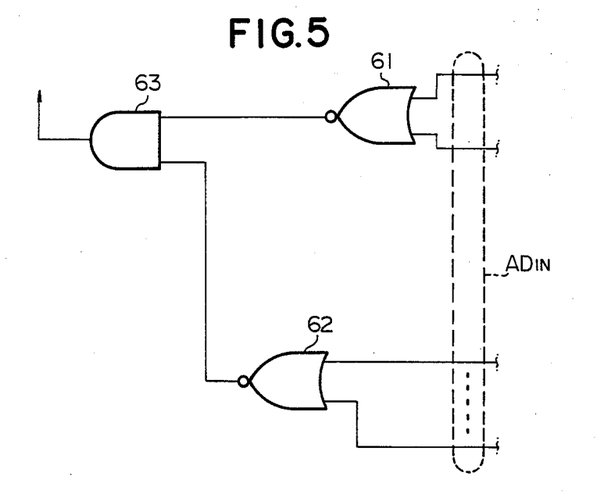
FIG. 5 is a logic diagram showing the arrangement of a modification of the logic data incorporated in the semiconductor memory device illustrated in FIG. 2.

In another implementation, the NOR gate 56 is replaced by a logic circuit illustrated in FIG. 5. The logic circuit illustrated in FIG. 5 comprises a plurality of NOR gates 61 and 62 and an AND gate 63, and the word line drive signal AD$_{IN}$ is divided into a plurality of bit groups which are supplied to the NOR gates 61 and 62, respectively. All of the output nodes of the NOR gates 61 and 62 are coupled to the input nodes of the AND gate 63, so that the input nodes of the AND gate 63 are reduced in number, thereby obtaining easy of fabrication.

Figure 6:
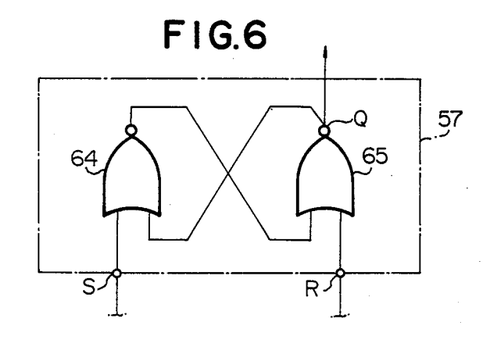
FIG. 6 is a logic diagram showing the arrangement of the second flip-flop circuit incorporated in the semiconductor memory device illustrated in FIG. 2.

The detailed circuit arrangement of the second R-S type flip-flop circuit 57 is illustrated in FIG. 6 of the drawings. The second R-S type flip-flop circuit 57 comprises two NOR gates 64 and 65 but is similar in circuit arrangement to the first R-S flip-flop circuit 32, so that detailed description will be omitted for the sake of simplicity.

Figure 7:
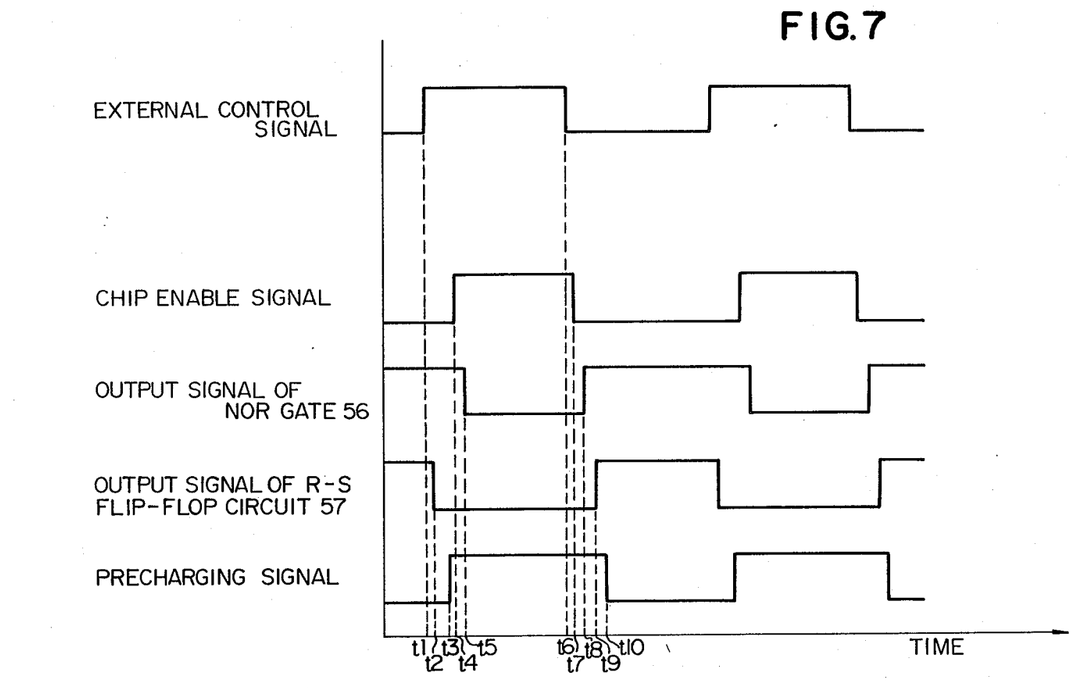
FIG. 7 is a diagram showing the waveforms of the essential signals appearing in the semiconductor memory device illustrated in FIG. 2.

Description will be hereinunder made for operation with reference to FIG. 7 of the drawings. When the external control signal EXT remains in the low voltage level, the second R-S type flip flop circuit 57 produces the output signal of the high voltage level, and, accordingly, the inverter circuit 58 produces the precharging signal PCH of the active low voltage level, because the NOR gate 56 produces the output signal of the high voltage level on the basis of the address bits of the word line drive signal AD$_{IN}$ of the logic "0" levels. The precharging signal PCH of the active low voltage level is supplied to the gate electrodes of the p-channel type precharging transistors of the precharging circuit 29, then all of the precharging transistors are turned on to supply the high voltage level to all of the bit lines. The inverter circuit 58 is also coupled to the setting node S of the first R-S type flip-flop circuit 32, so that no chip enable signal CE takes place at the output node Q thereof with the output signal of the high voltage level fed from the inverter circuit 31 to the resetting node R of the first R-S type flip-flop circuit 32. This absence of the chip enable signal authorizes the address bits of the word line drive signal AD$_{IN}$ to be in the logic "0" levels.

Upon accessing a data information preserved in the memory cell array 22, the external control signal EXT goes up to the high voltage level at time t1, then the second R-S type flip-flop circuit 57 shifts the output signal thereof from the high voltage level to the low voltage level at time t2. This results in that the inverter circuit 58 shifts the precharging signal PCH from the active low voltage level to the inactive high voltage level at time t3. With the inactive high voltage level, all of the precharging transistors turn off to finish the precharging operation. However the first R-S type flip-flop circuit 32 shifts the chip enable signal CE from the inactive low voltage level to the active high voltage level in a synchronous with the inactive high voltage level at time t4. With the chip enable signal CE of the active high voltage level, all of the gate transistors turn on to transfer the inverse of the internal address signal, because the external address signal AD$_{ext}$ has been already supplied to the address terminal 31 for production of the inverse of the word line drive signal. Then the word line drive signal AD$_{IN}$ is supplied to not only the memory cell array but also the NOR gate 56. The NOR gate 56 shifts the output signal from the high voltage level to the low voltage level at time t5 for the preparation of the subsequent access. The word line drive signal AD$_{IN}$ specifies an address of the memory cell array 22, so that a read/write operation is carried out to transfer the data information from or to the memory cell assigned by the word line drive signal AD$_{IN}$.

After specifying the address, the external control signal EXT goes down the low voltage level at time t6, so that the inverter circuit 31 shifts the output signal from the low voltage level to the high voltage level. This results in that the first R-S type flip-flop circuit 32 shifts the chip enable signal CE from the active high voltage level to the inactive low voltage level at time t7. Then, all of the address bits of the word line drive signal AD$_{IN}$ are shifted to the logic "0" levels, and, accordingly, the NOR gate 56 shifts the output signal from the low voltage level to the high voltage level at time t8. As a result, the second R-S type flip-flop circuit 57 shifts the output signal from the low voltage level to the high voltage level at time t9, and, therefore, the precharging signal PCH is shifted from the inactive high voltage level to the active low voltage level at time t10. With the active low voltage level, the precharging circuit 29 performs the precharging operation for the subsequent access.

As will be understood from the foregoing description, each of the control signals CE and PCH is produced in synchronous with the signal related to the operation of the controlled circuit such as the address decoder circuit 35 or the precharging circuit 29 regardless of a clock signal. Then, the control signal generating circuit incorporated in the semiconductor memory device illustrated in FIG. 2 is capable of producing the timings each immediately following the completion of the previous operation. This results in production of precise timings without idling time period. Moreover, the control signal generating circuit according to the present invention is advantageous over the prior-art in reduction of circuit components.

Although particular embodiments of the present invention have been shown and described, it will be obvious to those skilled in the art that various changes and modifications may be made without departing from the spirit and scope of the present invention.

What is claimed is:
1. A semiconductor memory device fabricated in a semiconductor substrate, comprising:
 (a) a control node to which an external control signal is applied, said external control signal being shifted between a first level and a second level;
 (b) a memory cell array having a plurality of memory cells each arranged in a matrix form of rows and columns;

(c) an address decoder circuit, having a plurality of decoder outputs respectively coupled to said rows, for selecting one of the decoder outputs when actuated by a first control signal in an active level on the basis of an external address signal, said first control signal being shifted between said active level and an inactive level;

(d) a precharging circuit actuated by a second control signal in an active level and performing a precharging operation prior to a read/write operation, said second control signal being shifted between said active level and an inactive level;

(e) a first control circuit responsive to said external control signal in said second level for shifting said first control signal from said active level to said inactive level and to said second control signal in said inactive level for shifting said first control signal from said inactive level to said active level;

(f) a logic gate producing an additional control signal of said first level when all of said decoder outputs are in an inactive state, said additional control signal being shifted between said first level and said second level; and (g) a second control circuit responsive to said external control signal in said first level for shifting said second control signal from said active level to said inactive level and to said additional control signal in said first level for shifting the second control signal from said inactive level to said active level.

2. A semiconductor memory device as set forth in claim 1, in which said logic gate comprises a NOR gate.

3. A semiconductor memory device as set forth in claim 1, in which said logic gate comprises two NOR gates, each supplied with signals from said decoder circuit and an AND gate supplied with output signals fed from the two NOR gates for production of said additional control signal.

4. A semiconductor memory device as set forth in claim 1, in which said precharging circuit comprises a plurality of precharging transistors respectively coupled between said columns of said memory cell array and a source of a precharge voltage.

5. A semiconductor memory device as set forth in claim 1, in which said first control circuit is formed by a flipflop circuit having two input nodes, one of which is supplied with an inverse of said external control signal and the other of which is supplied with said second control signal.

6. A semiconductor memory device as set forth in claim 5, in which said flip-flop circuit is of the R-S type.

7. A semiconductor memory device as set forth in claim 1, in which said second control circuit is formed by a flip-flop circuit having two input nodes, one of which is supplied with said external control signal and the other of which is supplied with said additional control signal, wherein said second control circuit further comprises an inverter circuit coupled to an output node of said flip-flop circuit for producing said second control signal.

8. A semiconductor memory device as set forth in claim 7, in which said flip-flop circuit is of the R-S type.

9. A memory circuit comprising a memory cell array arranged in a matrix form of rows and columns, means for operatively precharging said memory cell array, an address decoder for operatively selecting one of said rows of said memory cell array, a detection circuit for generating a detection signal upon detecting that all of said decoder outputs are in an inactive state, a first R-S flip-flop circuit which is set and reset in response to said detection signal and a first level of an external control signal, respectively, means for enabling said precharge means in response to the set state of said first R-S flip-flop circuit, a second R-S flip-flop circuit which is set and reset in response to said reset state of said first R-S flip-flop circuit and a second level of said external control signal, respectively, and means for operatively enabling said address decoder in response to the set state of said second R-S flip-flop circuit.

* * * * *

UNITED STATES PATENT AND TRADEMARK OFFICE
CERTIFICATE OF CORRECTION

PATENT NO. : 4,918,657

DATED : April 17, 1990

INVENTOR(S) : Yasushi Takahashi

It is certified that error appears in the above-identified patent and that said Letters Patent is hereby corrected as shown below:

Col. 2, line 60, after "a" insert --second--.

Col. 3, line 36, delete "data" and insert --gate--;

Col. 3, line 63, delete "28" and insert --29--.

Col. 8, line 5, delete "flipflop" and insert --flip-flop--.

Signed and Sealed this

Twenty-second Day of October, 1991

Attest:

HARRY F. MANBECK, JR.

*Attesting Officer*     *Commissioner of Patents and Trademarks*